United States Patent
Kim et al.

(10) Patent No.: US 8,379,477 B2
(45) Date of Patent: Feb. 19, 2013

(54) SUB-WORD-LINE DRIVING CIRCUIT, SEMICONDUCTOR MEMORY DEVICE HAVING THE SAME, AND METHOD OF CONTROLLING THE SAME

(75) Inventors: Cheol Kim, Seoul (KR); Sang-Kyun Park, Hwaseong-si (KR); Jung-Bae Lee, Seongnam-si (KR); Jun-Phyo Lee, Yongin-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 199 days.

(21) Appl. No.: 13/019,858

(22) Filed: Feb. 2, 2011

(65) Prior Publication Data

US 2011/0228624 A1   Sep. 22, 2011

(30) Foreign Application Priority Data

Feb. 4, 2010   (KR) .................... 10-2010-0010518

(51) Int. Cl.
  *G11C 8/10*   (2006.01)
(52) U.S. Cl. .............................. 365/230.06; 365/189.05
(58) Field of Classification Search ............. 365/230.06, 365/189.05
  See application file for complete search history.

(56) References Cited

U.S. PATENT DOCUMENTS

| 6,249,477 | B1 | 6/2001 | Ohtsuki | |
|---|---|---|---|---|
| 7,274,584 | B2 | 9/2007 | Jung et al. | |
| 7,729,195 | B2 | 6/2010 | Youn et al. | |
| 2006/0044922 | A1* | 3/2006 | Ueda | 365/230.06 |
| 2006/0176758 | A1* | 8/2006 | Chun | 365/230.06 |

FOREIGN PATENT DOCUMENTS

| JP | 11-031384 | 2/1999 |
|---|---|---|
| JP | 2000-057768 | 2/2000 |
| KR | 10-0311264 | 3/2000 |
| KR | 10-2005-0113303 | 12/2005 |

* cited by examiner

*Primary Examiner* — Michael Tran
(74) *Attorney, Agent, or Firm* — Muir Patent Consulting, PLLC

(57) ABSTRACT

Provided is a semiconductor memory device including a sub-word-line driving circuit capable of reducing an amount of leakage current due to coupling. The semiconductor memory device includes a word-line enable signal generating circuit and a sub-word-line driving circuit. The sub-word-line driving circuit provides a pull-down current path between a selected word line and ground for a pulse type period of time in a precharge mode following an active mode for the selected word line, generates a word line driving signal on the basis of a main word line driving signal, a first sub-word-line control signal, and a second sub-word-line control signal, and provides the word line driving signal to a memory cell array. The semiconductor memory device may reduce an amount of leakage current flowing to a ground through the sub-word-line driving circuit.

20 Claims, 6 Drawing Sheets

SUB-WORD-LINE DRIVING CIRCUIT, SEMICONDUCTOR MEMORY DEVICE HAVING THE SAME, AND METHOD OF CONTROLLING THE SAME

CROSS-REFERENCE TO RELATED APPLICATION

This application claims priority under 35 U.S.C. §119 to Korean Patent Application No. 10-2010-0010518 filed on Feb. 4, 2010, the disclosure of which is hereby incorporated by reference in its entirety.

BACKGROUND

1. Field

Embodiments of the inventive concept relate to a semiconductor memory device, and more particularly to a semiconductor memory device including a sub-word-line driving circuit and a method of controlling the sub-word-line driving circuit.

2. Description of Related Art

Semiconductor memory devices are used in various electronic products and applications to store data. In typical semiconductor memory devices, memory cells are arranged at intersections where bit lines and word lines intersect, a sense amplifier for amplifying a sensed voltage of a memory cell is coupled to the bit lines, and a sub-word-line driving circuit for generating a sub-word-line driving signal is coupled to the word lines.

In some cases, an undesired current path (simple cross) may be formed between bit lines and word lines due to coupling in a semiconductor manufacturing process. When the undesired current path is formed between the bit lines and the word lines as described above, a large leakage current may flow from the word line to the ground via the sub-word-line driving circuit. Accordingly, a standby current of the semiconductor memory device increases and the variation of a voltage level of a precharge voltage increases.

SUMMARY

Embodiments of the inventive concept provide a sub-word-line driving circuit capable of decreasing a leakage current when an undesired current path is generated between a word line and a bit line.

Embodiments of the inventive concept also provide a semiconductor memory device including the sub-word-line driving circuit.

The technical objectives of the inventive concept are not limited to the above disclosure; other objectives may become apparent to those of ordinary skill in the art based on the following descriptions.

In accordance with an aspect of the inventive concept, a semiconductor memory device includes a word-line enable signal generating circuit configured to generate a first sub-word-line control signal (PXID) and a second sub-word-line control signal (PXIB). The signals PXID and PXIB may be generated on the basis of a sub-word-line driving signal (PXI). A sub-word-line driving circuit provides a pull-down current path to a selected word line for a pulse type period of time in a precharge mode following an active mode for the selected word line, generates a word line driving signal on the basis of a main word line driving signal (NWEI), the first sub-word-line control signal, and the second sub-word-line control signal, and provides the word line driving signal to a memory cell array.

In some embodiments, the sub-word-line driving circuit may include a switch configured to pull down a potential of the selected word line in response to a pulse type of gate control signal in the precharge mode.

In some embodiments, the switch may be a MOS transistor.

In some embodiments, the MOS transistor may be arranged in a conjunction region of a memory core.

In some embodiments, a pull-down current path may be prevented from being provided for the pulse type period of time to a non-selected word line during the precharge mode following the active mode.

In some embodiments, the sub-word-line driving circuit may include a PMOS transistor having a gate to which the main word line driving signal is applied, a source to which the first sub-word-line control signal is applied, and a drain connected to a first node; a first NMOS transistor having a gate to which the main word line driving signal is applied and a drain connected to the first node; a second NMOS transistor having a gate to which the second sub-word-line control signal is applied, a drain connected to the first node, and a source connected to ground; and a third NMOS transistor having a drain connected to the source of the first NMOS transistor, a gate to which a gate control signal is applied, and a source connected to the ground.

In some embodiments, the gate control signal may be a pulse type of voltage signal enabled during the precharge mode for a time shorter than a time period of the precharge mode.

In some embodiments, a size of the first NMOS transistor may be larger than the size of the second NMOS transistor.

In some embodiments, the third NMOS transistor may be arranged in a conjunction region of a memory core.

In some embodiments, the sub-word-line driving circuit is further configured to provide an additional pull-down current path between the selected word line and ground for a non-pulse type period of time in the precharge mode following the active mode for the selected word line, wherein the non-pulse type period of time is longer than the pulse type period of time and includes the pulse type period of time and additional time. The pull-down current path may be configured to not pass a current between the word line and ground during the additional time, and to pass a current between the word line and ground during the pulse type period of time.

In some embodiments, the sub-word-line driving circuit may include a PMOS transistor having a gate to which the main word line driving signal is applied, a source to which the first sub-word-line control signal is applied, and a drain connected to a first node; a first NMOS transistor that is part of the pull-down current path, and that has a gate to which a pulse type of third sub-word-line control signal enabled during the precharge mode for a time period shorter than a time period of the precharge mode is applied, a drain connected to the first node, and a source connected to a ground; and a second NMOS transistor that is part of an additional pull-down current path between the selected word line and ground, the second NMOS transistor having a gate to which the second sub-word-line control signal is applied, a drain connected to the first node, and a source connected to the ground.

In some embodiments, a size of the first NMOS transistor may be larger than the size of the second NMOS transistor.

In some embodiments, the sub-word-line driving circuit may include a PMOS transistor having a gate to which the main word line driving signal is applied, a source to which the first sub-word-line control signal is applied, and a drain connected to a first node; a first NMOS transistor that is part of an additional pull-down current path between the selected word line and ground, the first NMOS transistor having a gate to which the main word line driving signal is applied, a drain connected to the first node, and a source connected to a ground; and a second NMOS transistor that is part of the pull-down current path, the second NMOS transistor having a gate to which a pulse type of third sub-word-line control signal is applied, a drain connected to the first node, and a source connected to the ground.

In some embodiments, a size of the second NMOS transistor may be larger than the size of the first NMOS transistor.

In some embodiments, the word-line enable signal generating circuit may be laid out in a conjunction region of a memory core.

In accordance with another aspect of the inventive concept, a sub-word-line driving circuit includes a PMOS transistor having a gate to which a main word line driving signal is applied, a source to which a first sub-word-line control signal is applied, and a drain connected to a first node. A first NMOS transistor has a gate to which the main word line driving signal is applied and a drain connected to the first node. A second NMOS transistor has a gate to which a second sub-word-line control signal is applied, a drain connected to the first node, and a source connected to a ground. A third NMOS transistor has a drain connected to the source of the first NMOS transistor, a gate to which a gate control signal enabled during a precharge mode for a pulse time period shorter than a time period during which the second sub-word line control signal is enabled during the precharge mode is applied, and a source connected to the ground.

In accordance with still another embodiment of the inventive concept, a method of controlling a sub-word-line driving circuit includes selecting a word line; providing a first pull-down current path between the selected word line and ground for a first period of time during a precharge mode following an active mode for the selected word line; providing a separate second pull-down current path between the selected word line and ground for a second period of time during the precharge mode following the active mode for the selected word line, wherein the second period of time includes the first period of time and is longer than the first period of time; and preventing a current from flowing through the first pull-down current path during the time of the second period of time that is not included in the first period of time.

BRIEF DESCRIPTION OF THE DRAWINGS

The foregoing and other features and advantages of the inventive concepts will be apparent from the more particular description of preferred embodiments disclosed herein, as illustrated in the accompanying drawings in which like reference characters refer to like parts throughout the different views. The drawings are not necessarily to scale, emphasis instead being placed upon illustrating the principles of the inventive concepts. In the drawings.

DETAILED DESCRIPTION

Figure 1:
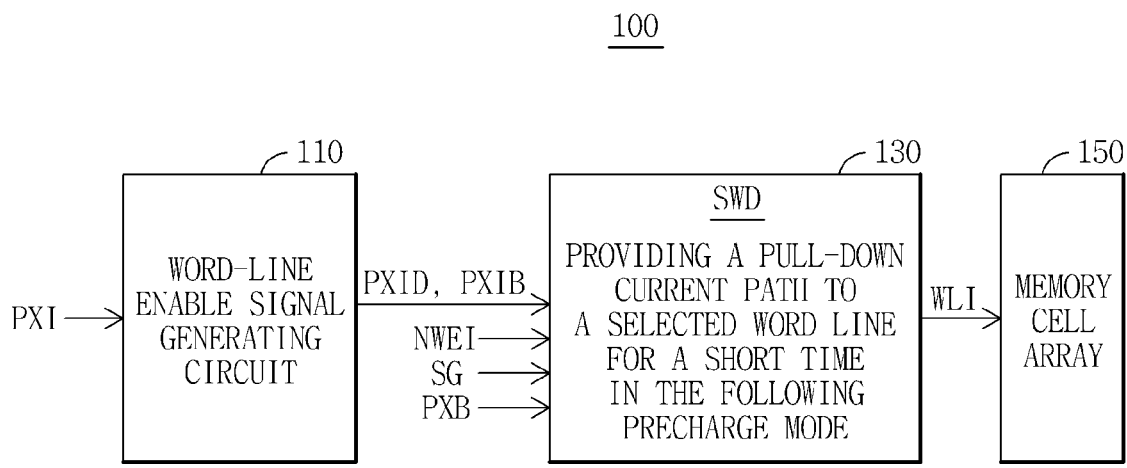
FIG. 1 is a block diagram showing a memory core part of a semiconductor memory device in accordance with exemplary embodiments.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of regions may be exaggerated for clarity.

It will be understood that when an element is referred to as being "on," "connected to" or "coupled to" another element, it can be directly on, connected or coupled to the other element or intervening elements may be present. In contrast, when an element is referred to as being "directly on," "directly connected to" or "directly coupled to" another element, there are no intervening elements present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the inventive concept will now be described with reference to the accompanying drawings.

FIG. 1 is a block diagram showing a memory core part of a semiconductor memory device in accordance with exemplary embodiments of the inventive concept.

Referring to FIG. 1, a semiconductor memory device 100 includes a word-line enable signal generating circuit 110, a sub-word-line driving circuit 130, and a memory cell array 150.

On the basis of a sub-word-line driving signal PXI, which could be comprised in one embodiment of a plurality of address signals, the word-line enable signal generating circuit 110 generates a first sub-word-line control signal PXID and a second sub-word-line control signal PXIB. The sub-word-line driving circuit 130 provides a pull-up current path between the first sub-word line control signal PXID and a word line during an active mode in which the first sub-word-line control signal PXID is enabled. The sub-word-line driving circuit 130 also provides a pull-down current path to a selected word line for a short time in a precharge mode following an active mode during which the word line was selected. The short time may include a brief pulse long enough to pull the word line to ground, but shorter than the time period during which the word line is in the precharge mode. The sub-word-line driving circuit 130 generates a word line driving signal WLI on the basis of a main word line driving signal NWEI, the first sub-word-line control signal PXID, the second sub-word-line control signal PXIB, and a gate control signal SG. The memory cell array 150 operates in response to a word line driving signal WLI. In one embodiment, the sub-word-line driving circuit 130 may operate in response to a third sub-word-line control signal PXB instead of the gate control signal SG.

The sub-word-line driving circuit 130 may include a switch that pulls down a potential of the selected word line in response to a pulse type of gate control signal enabled during the precharge mode immediately following an active mode for the selected word line. In one embodiment, while the pull-down current path is provided to the previously selected word line for the short time in the precharge mode immediately following the active mode, no pull-down current paths are provided to non-selected word lines during the pre-charge period immediately following the active mode for the previously selected word line.

Therefore, in one embodiment, the semiconductor memory device 100 including the sub-word-line driving circuit 130 shown in FIG. 1 provides the current path to a selected word line only for the short time following the active period for the selected word line and during the precharge mode. Accordingly, when an undesired current path (simple cross) is generated between a bit line and a word line, it is possible to reduce an amount of leakage current flowing from the word line to the ground through the sub-word-line driving circuit. Therefore, a standby current of the semiconductor memory device 100 may decrease and the variation of a voltage level of a precharge voltage VBL may decrease.

Figure 2:
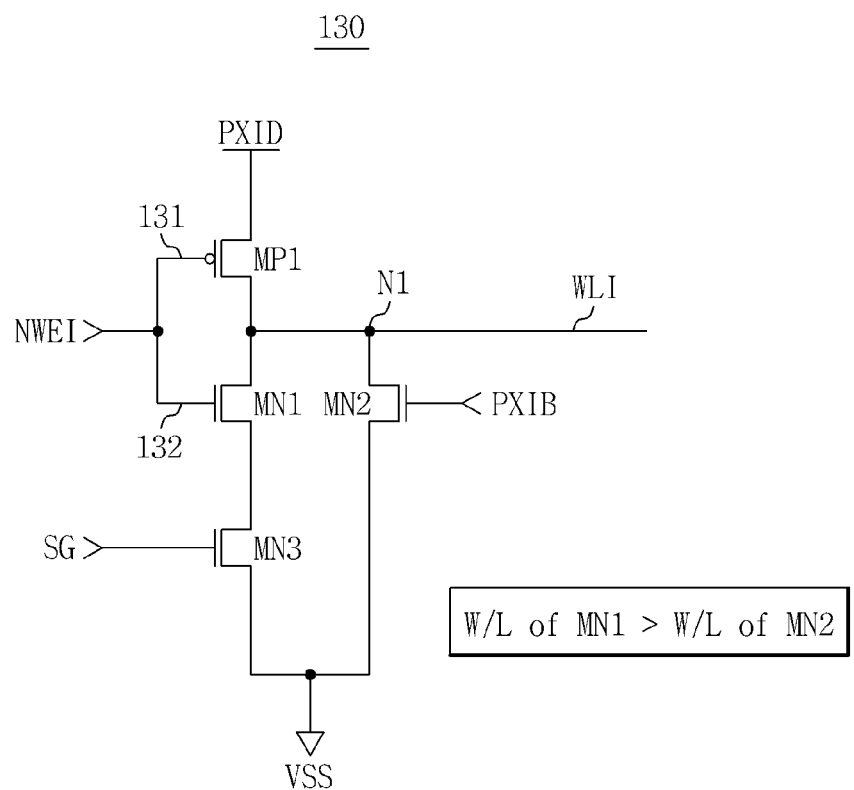
FIG. 2 is a circuit diagram showing an example of a sub-word-line driving circuit of the semiconductor memory device of FIG. 1, in accordance with an exemplary embodiment.

FIG. 2 is a circuit diagram showing an example of the sub-word-line driving circuit 130 constituting the semiconductor memory device 100 of FIG. 1, according to one embodiment.

Referring to FIG. 2, the sub-word-line driving circuit 130 includes a first PMOS transistor MP1, a first NMOS transistor MN1, a second NMOS transistor MN2, and a third NMOS transistor MN3.

The first PMOS transistor MP1 has a gate to which the main word line driving signal NWEI is applied, a source to which the first sub-word-line control signal PXID is applied, and a drain connected to a first node N1. The first NMOS transistor MN1 has a gate to which the main word line driving signal NWEI is applied and a drain connected to the first node N1. The second NMOS transistor MN2 has a gate to which the second sub-word-line control signal PXIB is applied, a drain connected to the first node N1, and a source connected to a ground VSS. The third NMOS transistor MN3 has a drain connected to the source of the first NMOS transistor MN1, a gate to which the gate control signal SG is applied, and a source connected to the ground VSS. The first node N1 is electrically connected to the word line WLI.

The gate control signal SG may be a pulse type of voltage signal enabled for a short time in the precharge mode following an active mode. In the sub-word-line driving circuit 130 of FIG. 2, a size or width/length (W/L) of the first NMOS transistor MN1, as well as the size of the third NMOS transistor MN3, may be greater than that of the second NMOS transistor MN2, such that the first and third NMOS transistors MN1 and MN3 pull down a word line voltage more quickly than the second NMOS transistor in the precharge mode.

In the embodiment described above, two paths are provided for pulling the word line to ground. A first path includes an NMOS transistor MN2 that is smaller so, when on, it pulls the word line down to ground using a smaller current but in a slower manner. A second path includes NMOS transistors MN1 and MN3 that are larger so, when on, they pull the word line down to ground faster than the first path, but use a larger current. Thus, the pulse type signal is used for the second path to turn on the third NMOS transistor MN3 for only a short period, thereby pulling down the word line to ground quickly, but only using the larger current for the short period of time. Thereafter, no current flows through the second path, and only a small current flows through the first path in order to keep the word line pulled down to ground. Current leakage is thereby reduced.

The third NMOS transistor MN3 may be arranged in a conjunction region of a memory core as described later with reference to FIG. 10. If the third NMOS transistor MN3 having a power gate function included in the sub-word-line driving circuit 130 is located in the conjunction region of the memory core, it is possible to prevent an increase of an area of a sub-word-line driving circuit region of the memory core.

Figure 3:
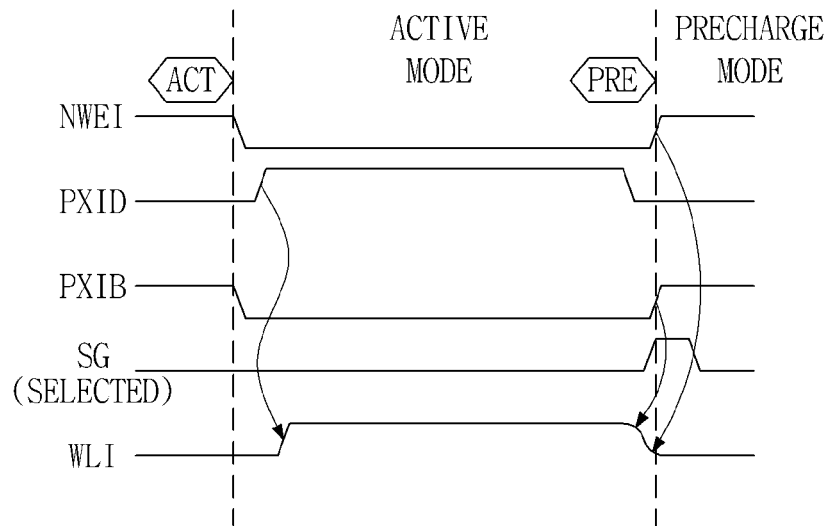
FIG. 3 is a timing diagram showing an exemplary operation of the sub-word-line driving circuit of FIG. 2, in accordance with one embodiment.

FIG. 3 is an exemplary timing diagram showing the operation of the sub-word-line driving circuit 130 of FIG. 2, according to one embodiment. The semiconductor memory device 100 shown in FIG. 1 enters an active mode in response to an active command ACT, and enters the precharge mode in response to a precharge command PRE. In one embodiment, during the active mode, a first word line of an array is selected while the remaining word lines of the array are not selected, and during the precharge mode following the active mode, all of the word lines of the array are un-selected.

Referring to FIG. 3, the main word line driving signal NWEI has a logic low state in the active mode and has a logic high state in the precharge mode. That is, the main word line driving signal NWEI is a signal enabled in the logic low state. The first sub-word-line control signal PXID has the logic high state in the active mode and has the logic low state in the precharge mode. In the active mode, the first sub-word-line control signal PXID may have a voltage level of a boosted voltage VPP. The second sub-word-line control signal PXIB has the logic low state in the active mode, and has the logic high state in the precharge mode. In the precharge mode, the second sub-word-line control signal PXIB may have a voltage level of a cell array power supply voltage VINTA or the boosted voltage VPP.

The gate control signal SG provided to the sub-word-line driving circuit 130 coupled to a selected word line has the logic low state in the active mode, and is the pulse type of voltage signal enabled for the short time in the precharge mode following the active mode. In one embodiment, the short time is a shorter time than the array is in the precharge mode (e.g., a fraction of the time, such as less than 1%, 10%, 20%, 50%, etc., of the time), and is a time sufficient to pull the word line to ground. However, for non-selected sub-wordlines, in both the active mode and the precharge mode, the gate control signal SG provided to the sub-word-line driving circuit coupled to a non-selected word line may remain in the logic low state. Accordingly, in one embodiment, while the pulse type pull-down current path is provided to a selected word line for a short time in the precharge mode following an active mode, no pulse type pull-down current paths are provided to the non-selected word lines during the precharge mode following the active mode. The word line driving signal WLI applied to the selected word line has the logic high state in the active mode and has the logic low state in the precharge mode.

When an undesired current path (simple cross) is generated between a bit line and a word line, the sub-word-line driving circuit 130 shown in FIG. 2 may decrease an amount of leakage current flowing from the word line to the ground through the sub-word-line driving circuit by using the third NMOS transistor MN3 operating as the power gate in response to the gate control signal SG as the pulse type of voltage signal enabled for the short time in the precharge mode.

Figure 4:
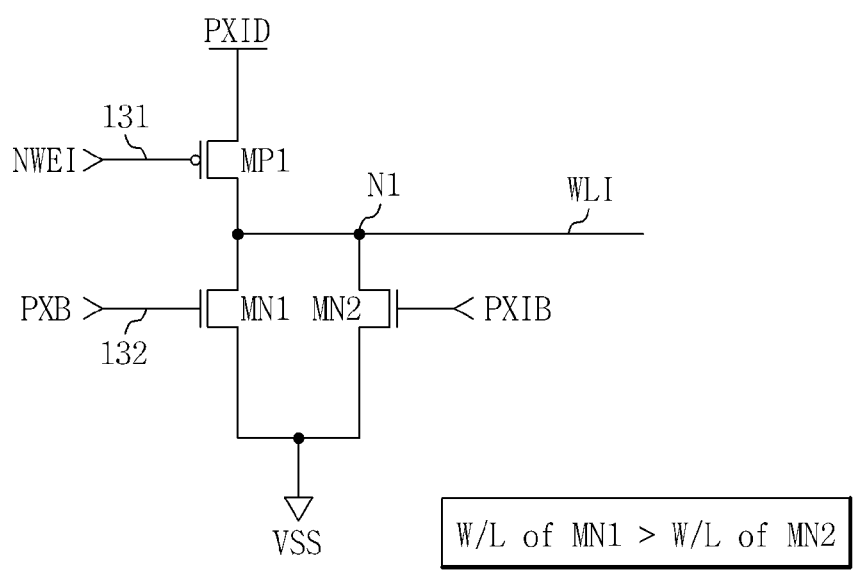
FIG. 4 is a circuit diagram showing another example of the sub-word-line driving circuit of the semiconductor memory device of FIG. 1, in accordance with another exemplary embodiment.

FIG. 4 is an exemplary circuit diagram showing another example of the sub-word-line driving circuit 130 constituting the semiconductor memory device 100 of FIG. 1, according to another embodiment.

Referring to FIG. 4, a sub-word-line driving circuit 130a includes a first PMOS transistor MP1, a first NMOS transistor MN1 forming a first path to ground, and a second NMOS transistor MN2 forming a second path to ground.

The first PMOS transistor MP1 has a gate to which the main word line driving signal NWEI is applied, a source to which the first sub-word-line control signal PXID is applied, and a drain connected to a first node N1. The first NMOS transistor MN1 has a gate to which a pulse type of third sub-word-line control signal PXB enabled for a short time in a precharge mode following an active mode, a drain connected to the first node N1, and a source connected to a ground VSS. The second NMOS transistor MN2 has a gate to which the second sub-word-line control signal PXIB is applied, a drain connected to the first node N1, and a source connected to the ground VSS.

In the sub-word-line driving circuit 130a of FIG. 4, a size or width/length (W/L) of the first NMOS transistor MN1 may be greater than that of the second NMOS transistor MN2. As a result, the first NMOS transistor MN1 pulls down a word line voltage more quickly than the second NMOS transistor in the precharge mode.

Figure 5:
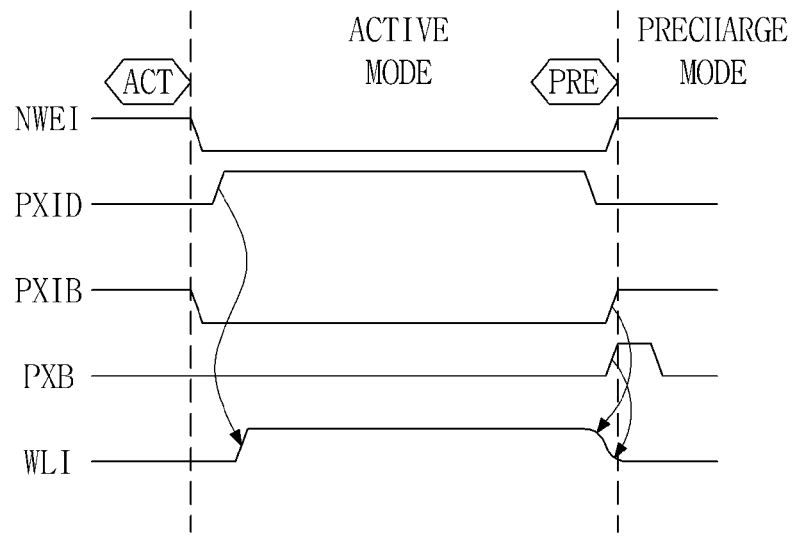
FIG. 5 is a timing diagram showing an exemplary operation of the sub-word-line driving circuit of FIG. 4, in accordance with an exemplary embodiment.

FIG. 5 is an exemplary timing diagram showing the operation of the sub-word-line driving circuit 130a of FIG. 4, according to one embodiment.

Referring to FIG. 5, the main word line driving signal NWEI has the logic low state in the active mode and has the logic high state in the precharge mode. That is, the main word line driving signal NWEI is a signal enabled in the logic low state. The first sub-word-line control signal PXID has the logic high state in the active mode and has the logic low state in the precharge mode. The second sub-word-line control signal PXIB has the logic low state in the active mode, and has the logic high state in the precharge mode.

The third sub-word-line control signal PXB provided to the sub-word-line driving circuit 130 coupled to the selected word line has the logic low state in the active mode, and is a pulse type of voltage signal enabled for the short time in the precharge mode following the active mode for the selected word line. In both the active mode and the precharge mode, the third sub-word-line control signal PXB provided to the sub-word-line driving circuit coupled to non-selected word lines may have the logic low state without any pulse type voltage enable signal.

In the embodiment of FIG. 5, while the pulse type pulldown current path is provided to the selected word line for the short time in the precharge mode, no pulse type pull-down current path is be provided to the non-selected word lines during the precharge mode. The word line driving signal WLI applied to the selected word line has the logic high state in the active mode and has the logic low state in the precharge mode.

When an undesired current path (simple cross) is generated between a bit line and a word line, the sub-word-line driving circuit 130a shown in FIG. 4 may decrease an amount of leakage current flowing from the word line to the ground through the sub-word-line driving circuit by using the first NMOS transistor MN1 operating in response to the third sub-word-line control signal PXB as a pulse type of voltage signal enabled for the short time in the precharge mode.

Figure 6:
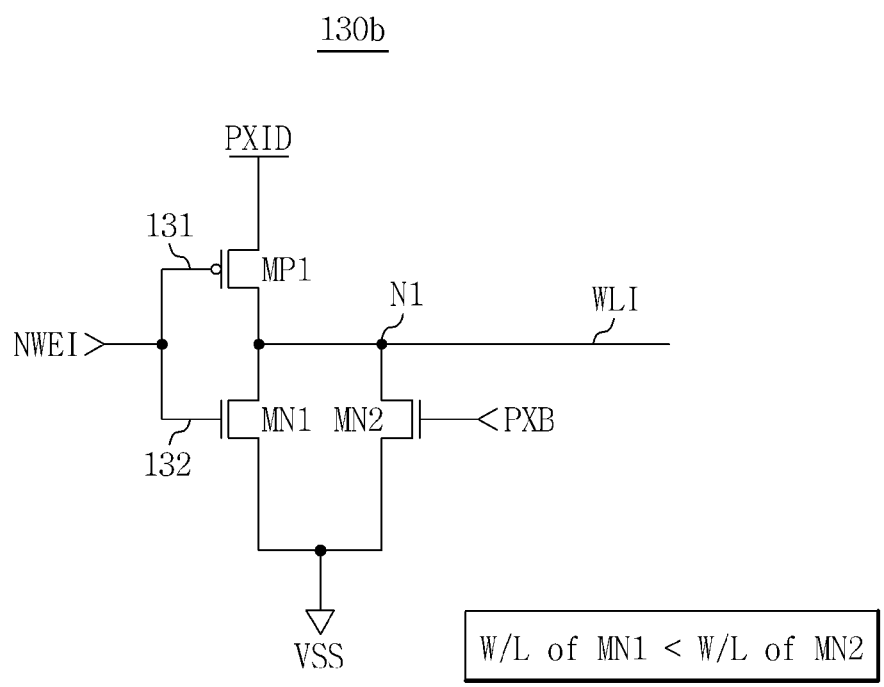
FIG. 6 is a circuit diagram showing still another example of the sub-word-line driving circuit of the semiconductor memory device of FIG. 1, in accordance with a further embodiment.

FIG. 6 is an exemplary circuit diagram showing still another example of the sub-word-line driving circuit 130 constituting the semiconductor memory device 100 of FIG. 1, according to one embodiment.

Referring to FIG. 6, a sub-word-line driving circuit 130b includes a first PMOS transistor MP1, a first NMOS transistor MN1 forming a first path to ground, and a second NMOS transistor MN2 forming a second path to ground.

The first PMOS transistor MP1 has a gate to which the main word line driving signal NWEI is applied, a source to which the first sub-word-line control signal PXID is applied, and a drain connected to a first node N1. The first NMOS transistor MN1 has a gate to which the main word line driving signal NWEI is applied, a drain connected to the first node N1, and a source connected to a ground VSS. The second NMOS transistor MN2 has a gate to which a pulse type of third sub-word-line control signal PXB enabled for a short time in the precharge mode following an active mode is applied, a drain connected to the first node N1, and a source connected to the ground VSS.

In one embodiment of the sub-word-line driving circuit 130b of FIG. 6, a size or width/length (W/L) of the second NMOS transistor MN2 may be greater than that of the first NMOS transistor MN1. As a result of its larger size, the second NMOS transistor MN2 pulls down a word line voltage more quickly than the first NMOS transistor in the precharge mode.

Figure 7:
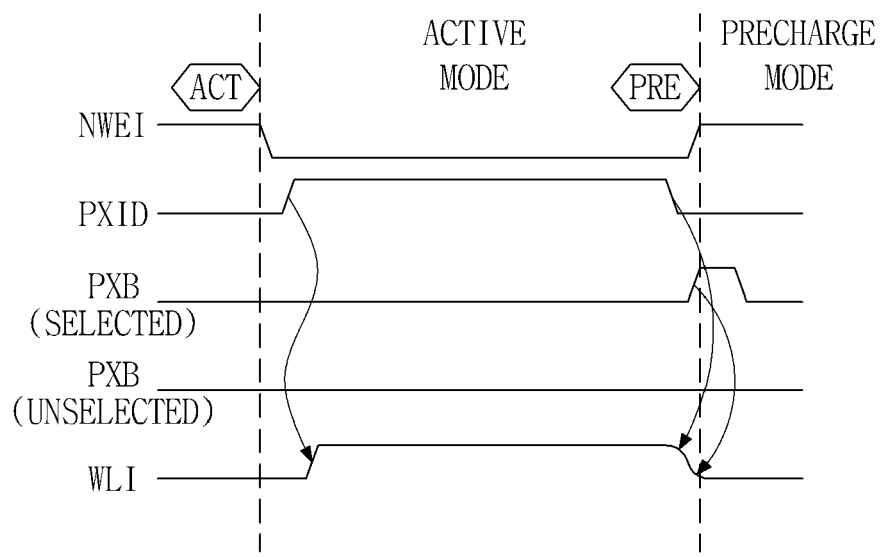
FIG. 7 is a timing diagram showing an exemplary operation of the sub-word-line driving circuit of FIG. 6, in accordance with an exemplary embodiment.

FIG. 7 is an exemplary timing diagram showing the operation of the sub-word-line driving circuit 130b of FIG. 6, according to one embodiment.

Referring to FIG. 7, the main word line driving signal NWEI has the logic low state in the active mode and has the logic high state in the precharge mode. That is, the main word line driving signal NWEI is a signal enabled in the logic low state. The first sub-word-line control signal PXID has the logic high state in the active mode and has the logic low state in the precharge mode.

The third sub-word-line control signal PXB applied to the second NMOS transistor MN2 of the sub-word-line driving circuit 130b coupled to the selected word line has the logic low state in the active mode, and is a pulse type of voltage signal for the selected word line, enabled for a short time in the precharge mode following an active mode for the selected word line. A signal PXB having the logic low state in the active mode and also the logic low state in the precharge mode may be applied to an NMOS transistor of a sub-word-line driving circuit coupled to a non-selected word line corresponding to the second NMOS transistor MN2 of the sub-word-line driving circuit 130b coupled to the selected word line. As such, PXB for a non-selected word line shown in FIG. 7 has a logic low state during both the active mode and the precharge mode, as opposed to the PXB applied to the second NMOS transistor MN2 of the sub-word-line driving circuit 130b coupled to the selected word line, which includes a pulse type period of time during the precharge mode that is shorter than the period of time during which the first sub-word-line control signal PXID is enabled.

In the embodiment of FIG. 7, while the pulse type pull-down current path is provided to the selected word line for a short time in the precharge mode following an active mode, no pulse type pull-down current path is provided to a non-selected word line following the active mode for the selected word line. Also, in the embodiment of FIG. 7, the word line driving signal WLI applied to the selected word line has the logic high state in the active mode and has the logic low state in the precharge mode.

When an undesired current path (simple cross) is generated between a bit line and a word line, the sub-word-line driving circuit 130b shown in FIG. 6 may decrease an amount of leakage current flowing from the word line to the ground through the sub-word-line driving circuit by using the second NMOS transistor MN2 operating in response to the third sub-word-line control signal PXB as a pulse type of voltage signal enabled for the short time in the precharge mode.

Figure 8:
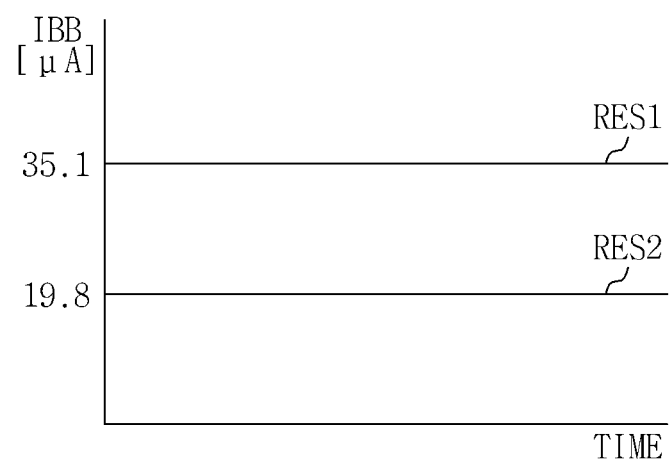
FIG. 8 is a diagram showing exemplary leakage currents in a sub-word-line driving circuit of the related art and the sub-word-line driving circuit in accordance with one or more embodiments of the inventive concept when an undesired current path (simple cross) is formed between a bit line and a word line.

FIG. 8 is an exemplary diagram showing leakage currents IBB to a sub-word-line driving circuit of the related art and the sub-word-line driving circuit in accordance with the embodiments of the inventive concept shown in FIG. 2, when an undesired current path (simple cross) is formed between a bit line and a word line.

Referring to FIG. 8, a leakage current RES2 flowing from the word line to the ground VSS through the first NMOS transistor MN1 of the sub-word-line driving circuit 130 in accordance with the embodiments of the inventive concept is 19.8 µA—a value more than 40% less than a leakage current RES1 (35.1 µA) of the sub-word-line driving circuit of the related art—when the undesired current path (simple cross) is generated between the word line and the bit line.

Using FIG. 2 as an example, when the undesired current path (simple cross) is generated between the word line and the bit line, a current flows from the bit line to the ground VSS through the word line during the precharge mode. The sub-word-line driving circuit 130 in accordance with the embodiments of the inventive concept shown in FIG. 2 has a third NMOS transistor MN3 which performs switching in response to a gate control signal SG as a pulse type of voltage signal enabled for a shortened period of time in the precharge mode. Accordingly, the sub-word-line driving circuit 130 provides a higher current pull-down current path to the selected word line only for a short time in the precharge mode. Since the sub-word-line driving circuit of the related art does not include the third NMOS transistor MN3 having a power gating function, and instead includes only a first large NMOS transistor MN1 directly connected to the ground, there is a problem in that a large leakage current flows from the word line to the ground VSS through the sub-word-line driving circuit when the undesired current path (simple cross) is generated between the word line and the bit line.

Since the sub-word-line driving circuits in accordance with the embodiments of the inventive concept shown in FIGS. 2-7 provide a higher current pull-down current path to the selected word line only for the short time in the precharge mode, an amount of leakage current that flows from the word line to the ground VSS through the sub-word-line driving circuit is small when an undesired current path (simple cross) is formed between a bit line and a word line.

Figure 9:
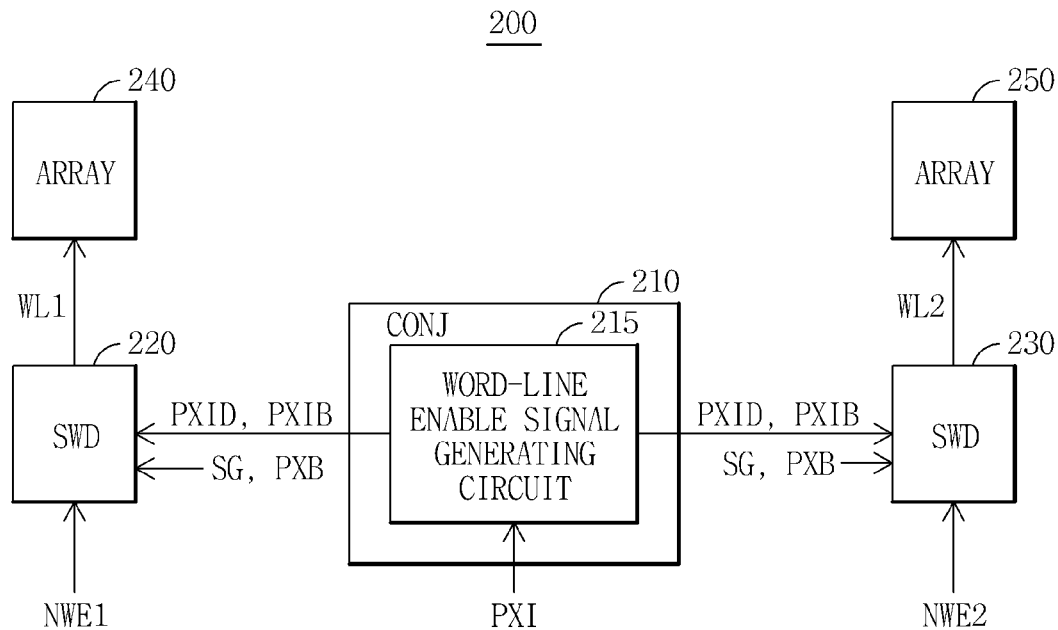
FIG. 9 is a diagram showing an example of a part of a memory core including sub-word-line driving circuits in accordance with exemplary embodiments of the inventive concept.

FIG. 9 is a diagram showing an example of a part of a memory core including sub-word-line driving circuits in accordance with embodiments of the inventive concept.

Referring to FIG. 9, a memory core 200 includes a conjunction region 210, sub-word-line driving circuit regions 220 and 230 and memory cell array regions 240 and 250. A sub-word-line driving circuit located in the first sub-word-line driving circuit region 220 generates a first word line driving signal WL1 on the basis of a first sub-word-line control signal PXID, a second sub-word-line control signal PXIB, and the main word-line driving signal NWE1. The memory cell array region 240 operates in response to the first word line driving signal WL1. A second sub-word-line driving circuit located in the second sub-word-line driving circuit region 230 generates a second word line driving signal WL2 on the basis of the first sub-word-line control signal PXID, the second sub-word-line control signal PXIB, and the main word-line driving signal NWE2. The memory cell array region 250 operates in response to the second word line driving signal WL1.

A word-line enable signal generating circuit 215 is located in the conjunction region 210, and generates the first sub-word-line control signal PXID and the second sub-word-line control signal PXIB, and provides the first sub-word-line control signal PXID and the second sub-word-line control signal PXIB to the first and second sub-word-line driving circuit regions 220 and 230. The word-line enable signal generating circuit 215 may generate the gate control signal SG and/or a third sub-word-line control signal PXB and provide the gate control signal SG or the third sub-word-line control signal PXB to the first and second sub-word-line driving circuit regions 220 and 230, as described above in connection with FIGS. 2-7.

Figure 10:
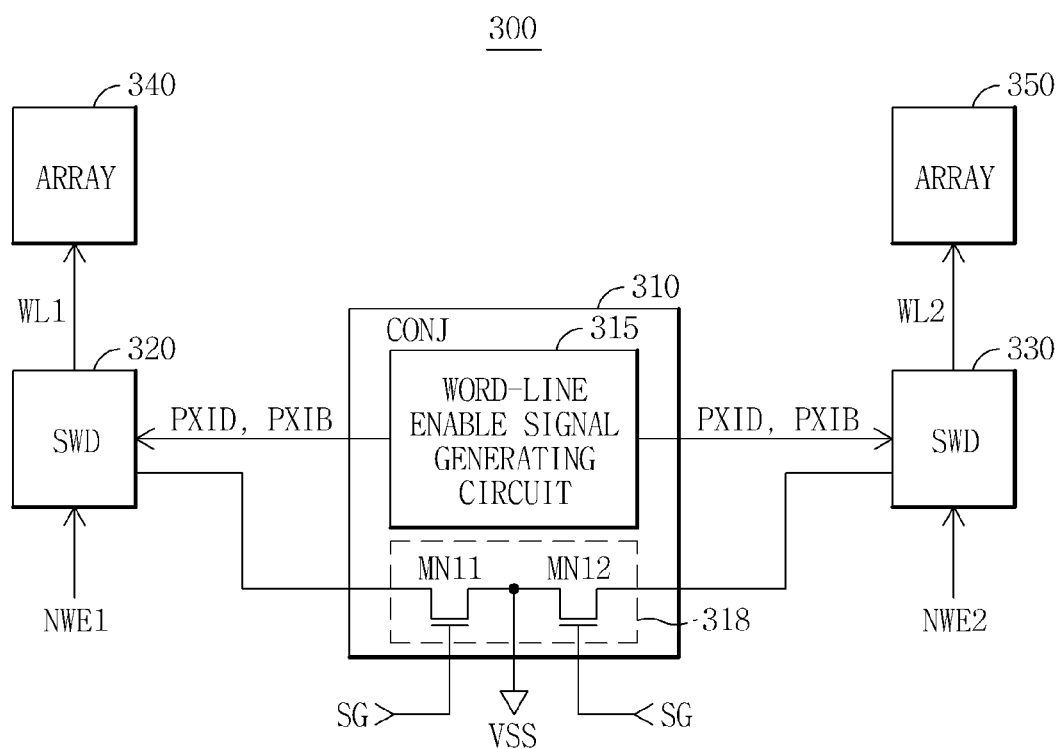
FIG. 10 is a diagram showing another example of a part of a memory core including sub-word-line driving circuits in accordance with exemplary embodiments of the inventive concept.

FIG. 10 is a diagram showing another example of a part of a memory core including sub-word-line driving circuits in accordance with embodiments of the inventive concept.

Referring to FIG. 10, a memory core 300 includes a conjunction region 310, sub-word-line driving circuit regions 320 and 330, and memory cell array regions 340 and 350.

A word-line enable signal generating circuit 315 is located in the conjunction region 310, and generates a first sub-word-line control signal PXID and a second sub-word-line control signal PXIB, and provides the first sub-word-line control signal PXID and the second sub-word-line control signal PXIB to the first and second sub-word-line driving circuit regions 320 and 330. An NMOS transistor MN11 having a power gate function of a third sub-word-line driving circuit and an NMOS transistor MN12 having a power gate function of a fourth sub-word-line driving circuit are located in the conjunction region 310.

The third sub-word-line driving circuit region 320 and the third sub-word-line driving circuit located in the conjunction region 310 generate a first word line driving signal WL1 on the basis of the first sub-word-line control signal PXID, the second sub-word-line control signal PXIB, and the main word-line driving signal NWE1. The memory cell array region 340 operates in response to the first word line driving signal WL1. The fourth sub-word-line driving circuit region 330 and the fourth sub-word-line driving circuit located in the conjunction region 310 generate a second word line driving signal WL2 on the basis of the first sub-word-line control signal PXID, the second sub-word-line control signal PXIB, and the main word-line driving signal NWE2. The memory cell array region 350 operates in response to the second word line driving signal WL2.

If the NMOS transistors having the power gate function included in the sub-word-line driving circuits are located in the conjunction region 310 as shown in FIG. 10, it is possible to prevent an increase of an area of the sub-word-line driving circuit regions 320 and 330.

Figure 11:
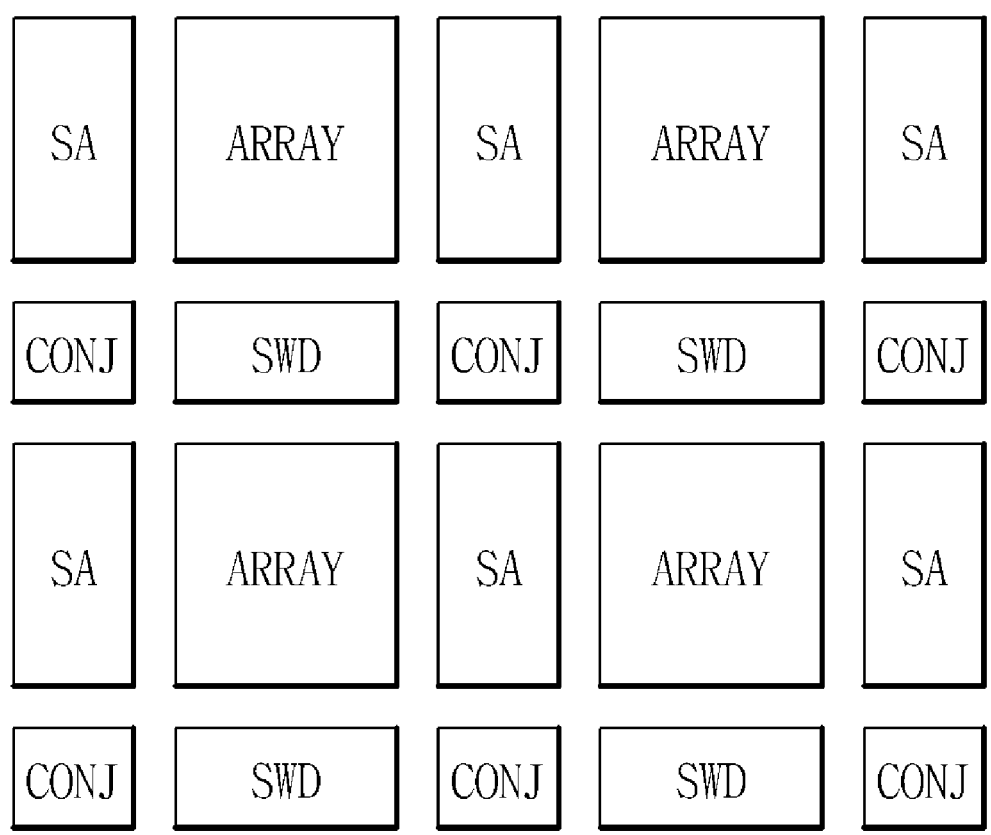
FIG. 11 is a diagram showing an example of the entire layout of a memory core including sub-word-line driving circuits in accordance with exemplary embodiments of the inventive concept.

FIG. 11 is a diagram showing an example of the entire layout of a memory core including sub-word-line driving circuits in accordance with embodiments of the inventive concept.

Referring to FIG. 11, the memory core has a sub-word-line driving circuit region SWD, a conjunction region CONJ, a sense amplifier region SA, and a memory cell array region ARRAY, which are repeatedly arranged. NMOS transistors having a power gate function of sub-word-line driving circuits as shown in FIG. 10 may be located in the conjunction region CONJ of the memory core of FIG. 11.

Referring to FIGS. 1 to 3, an exemplary method of controlling a sub-word-line driving circuit in accordance with embodiments of the inventive concept is as follows.

1) A first sub-word-line control signal PXID and a second sub-word-line control signal PXIB are generated on the basis of a sub-word-line driving signal PXI.

2) A pull-down current path is provided to a selected word line for a short time in a precharge mode following the active mode for the selected word line. For example, the current path may be a first current path that includes a first transistor that is enabled by a pulse type signal that is enabled for a short period of time. An additional pull-down current path may be provided to the selected word line in the precharge mode that includes a second transistor smaller than the first transistor and that is enabled by a signal enabled for a longer period of time than the pulse type signal 3) A word line driving signal WLI is generated on the basis of a main word line driving signal NWEI, the first sub-word-line control signal, and the second sub-word-line control signal.

4) The word line driving signal WLI is provided to a memory cell array.

Embodiments of the inventive concept are applicable to a semiconductor memory device, and are particularly applicable to a semiconductor memory device having a sub-word-line driving circuit. For example, the disclosed embodiments may be implemented in different types of memories, such as DRAM, PRAM, SRAM, Flash memory, MRAM, etc.

In accordance with embodiments of the inventive concept, a semiconductor memory device including a sub-word-line driving circuit provides a current path to a selected word line only for a short time in a precharge mode following an active mode. Accordingly, when an undesired current path (simple cross) is generated between a bit line and a word line, it is possible to reduce an amount of leakage current flowing from the word line to the ground through the sub-word-line driving circuit. Therefore, a standby current of the semiconductor memory device may decrease and the variation of a voltage level of a precharge voltage VBL may decrease.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
a word-line enable signal generating circuit configured to generate a first sub-word-line control signal and a second sub-word-line control signal; and
a sub-word-line driving circuit configured to:
provide a pull-down current path between a selected word line and ground for a pulse type period of time in a precharge mode following an active mode for the selected word line;
generate a word line driving signal on the basis of a main word line driving signal, the first sub-word-line control signal, and the second sub-word-line control signal; and
provide the word line driving signal to a memory cell array.

2. The semiconductor memory device according to claim 1, wherein the sub-word-line driving circuit comprises a switch configured to pull down a potential of the selected word line in response to a pulse type of gate control signal in the precharge mode.

3. The semiconductor memory device according to claim 2, wherein the switch is a MOS transistor.

4. The semiconductor memory device according to claim 3, wherein the MOS transistor is arranged in a conjunction region of a memory core.

5. The semiconductor memory device according to claim 1, wherein a pull-down current path is prevented from being provided to a non-selected word line during the pulse type period of time during the precharge mode following the active mode.

6. The semiconductor memory device according to claim 1, wherein the sub-word-line driving circuit comprises:
   a PMOS transistor having a gate to which the main word line driving signal is applied, a source to which the first sub-word-line control signal is applied, and a drain connected to a first node;
   a first NMOS transistor having a gate to which the main word line driving signal is applied and a drain connected to the first node;
   a second NMOS transistor having a gate to which the second sub-word-line control signal is applied, a drain connected to the first node, and a source connected to ground; and
   a third NMOS transistor having a drain connected to the source of the first NMOS transistor, a gate to which a gate control signal is applied, and a source connected to ground.

7. The semiconductor memory device according to claim 6, wherein the gate control signal is a pulse type of voltage signal enabled during the precharge mode for a time shorter than a time period during which the first sub-word line control signal is enabled in the precharge mode.

8. The semiconductor memory device according to claim 6, wherein a size of the first NMOS transistor is larger than that of the second NMOS transistor.

9. The semiconductor memory device according to claim 1, wherein:
   the sub-word-line driving circuit is further configured to provide an additional pull-down current path between the selected word line and ground for a non-pulse type period of time in the precharge mode following the active mode for the selected word line, wherein the non-pulse type period of time is longer than the pulse type period of time and includes the pulse type period of time and additional time.

10. The semiconductor memory device according to claim 9, wherein:
    the pull-down current path is configured to not pass a current between the word line and ground during the additional time, and to pass a current between the word line and ground during the pulse type period of time.

11. The semiconductor memory device according to claim 1, wherein the sub-word-line driving circuit comprises:
    a PMOS transistor having a gate to which the main word line driving signal is applied, a source to which the first sub-word-line control signal is applied, and a drain connected to a first node;
    a first NMOS transistor that is part of the pull-down current path, the first NMOS transistor having a gate to which a pulse type of third sub-word-line control signal enabled during the precharge mode for a time period shorter than a time period of the precharge mode is applied, a drain connected to the first node, and a source connected to ground; and
    a second NMOS transistor that is part of an additional pull-down current path between the selected word line and ground, the second NMOS transistor having a gate to which the second sub-word-line control signal is applied, a drain connected to the first node, and a source connected to ground.

12. The semiconductor memory device according to claim 11, wherein a size of the first NMOS transistor is larger than the size of the second NMOS transistor.

13. The semiconductor memory device according to claim 1, wherein the sub-word-line driving circuit comprises:
    a PMOS transistor having a gate to which the main word line driving signal is applied, a source to which the first sub-word-line control signal is applied, and a drain connected to a first node;
    a first NMOS transistor that is part of an additional pull-down current path between the selected word line and ground, the first NMOS transistor having a gate to which the main word line driving signal is applied, a drain connected to the first node, and a source connected to ground; and
    a second NMOS transistor that is part of the pull-down current path, the second NMOS transistor having a gate to which a pulse type of third sub-word-line control signal is applied during the precharge mode, a drain connected to the first node, and a source connected to the ground.

14. The semiconductor memory device according to claim 13, wherein a size of the second NMOS transistor is larger than the size of the first NMOS transistor.

15. The semiconductor memory device according to claim 1, wherein the word-line enable signal generating circuit is laid out in a conjunction region of a memory core.

16. A sub-word-line driving circuit comprising:
    a PMOS transistor having a gate to which a main word line driving signal is applied, a source to which a first sub-word-line control signal is applied, and a drain connected to a first node;
    a first NMOS transistor having a gate to which the main word line driving signal is applied and a drain connected to the first node;
    a second NMOS transistor having a gate to which a second sub-word-line control signal is applied, a drain connected to the first node, and a source connected to a ground; and
    a third NMOS transistor having a drain connected to the source of the first NMOS transistor, a gate to which a gate control signal enabled during a precharge mode for a pulse type time period shorter than a time period during which the second sub-word line control signal is enabled during the precharge mode is applied, and a source connected to the ground.

17. The sub-word-line driving circuit according to claim 16, wherein a size of the first NMOS transistor is larger than that of the second NMOS transistor.

18. The sub-word-line driving circuit according to claim 16, wherein the third NMOS transistor is arranged in a conjunction region of a memory core.

19. A method of controlling a sub-word-line driving circuit, comprising:
    selecting a word line;
    providing a first pull-down current path between the selected word line and ground for a first period of time during a precharge mode following an active mode for the selected word line;
    providing a separate second pull-down current path between the selected word line and ground for a second period of time during the precharge mode following the active mode for the selected word line, wherein the second period of time includes the first period of time and is longer than the first period of time; and preventing a current from flowing through the first pull-down current path during the time of the second period of time that is not included in the first period of time.

20. The method according to claim 19, wherein the steps of providing the first full-down current path, providing the separate second pull-down current path, and preventing reduce an amount of leakage current flowing from the word line to a ground by at least 20 percent.

* * * * *